United States Patent [19]
Gale et al.

[11] Patent Number: 6,117,796
[45] Date of Patent: Sep. 12, 2000

[54] REMOVAL OF SILICON OXIDE

[75] Inventors: Glenn W. Gale, Austin, Tex.; Rangarajan Jagannathan, Essex Junction, Vt.; Karen P. Madden, Poughquag, N.Y.; Kenneth J. McCullough, Fishkill, N.Y.; Harald F. Okorn-Schmidt, Putnam Valley, N.Y.; Keith R. Pope, Danbury, Conn.; David L. Rath, Stormville, N.Y.

[73] Assignee: International Business Machines Corporation, Armonk, N.Y.

[21] Appl. No.: 09/133,424

[22] Filed: Aug. 13, 1998

[51] Int. Cl.[7] .............................................. H01L 21/302
[52] U.S. Cl. ............................................................ 438/756
[58] Field of Search ............................................... 438/756

[56] References Cited

U.S. PATENT DOCUMENTS

| | | | |
|---|---|---|---|
| 3,676,240 | 7/1972 | Retajczyk | 156/17 |
| 3,860,464 | 1/1975 | Erdman et al. | 156/7 |
| 3,935,117 | 1/1976 | Suzuki et al. | 252/79.1 |
| 3,979,241 | 9/1976 | Maeda et al. | 156/13 |
| 4,230,523 | 10/1980 | Gajda | 156/657 |
| 4,267,013 | 5/1981 | Iida et al. | 156/643 |
| 4,269,654 | 5/1981 | Deckert et al. | 156/657 |
| 4,285,763 | 8/1981 | Coldren | 156/643 |
| 4,325,984 | 4/1982 | Galfo et al. | 427/38 |
| 4,334,349 | 6/1982 | Aoyama et al. | 29/579 |
| 4,351,696 | 9/1982 | Radigan | 156/643 |
| 4,395,304 | 7/1983 | Kern et al. | 156/657 |
| 4,444,618 | 4/1984 | Saia et al. | 156/643 |
| 4,472,237 | 9/1984 | Deslauriers et al. | 156/643 |
| 4,547,260 | 10/1985 | Takada et al. | 156/643 |
| 4,692,205 | 9/1987 | Sachdev et al. | 156/643 |
| 4,899,767 | 2/1990 | McConnell et al. | 134/56 R |
| 4,962,049 | 10/1990 | Chang et al. | 437/13 |
| 4,971,715 | 11/1990 | Armant et al. | 252/143 |
| 4,985,113 | 1/1991 | Fujimoto et al. | 156/643 |
| 4,985,990 | 1/1991 | Cronin et al. | 29/852 |
| 4,987,101 | 1/1991 | Kaanta et al. | 437/228 |
| 5,012,692 | 5/1991 | Nagano | 74/475 |
| 5,037,506 | 8/1991 | Gupta et al. | 156/646 |
| 5,082,518 | 1/1992 | Molinaro | 156/345 |
| 5,139,624 | 8/1992 | Searson et al. | 204/129.3 |
| 5,217,570 | 6/1993 | Kadomura | 156/665 |
| 5,308,440 | 5/1994 | Chino et al. | 156/664 |
| 5,320,709 | 6/1994 | Bowden et al. | 156/667 |
| 5,334,332 | 8/1994 | Lee | 252/548 |
| 5,338,416 | 8/1994 | Mlcak et al. | 204/129.3 |
| 5,348,619 | 9/1994 | Bohannon et al. | 156/664 |
| 5,348,627 | 9/1994 | Propst et al. | 204/129.3 |
| 5,350,488 | 9/1994 | Webb | 156/643 |
| 5,387,361 | 2/1995 | Kohara et al. | 252/79.1 |
| 5,407,860 | 4/1995 | Stolt et al. | 437/180 |
| 5,419,779 | 5/1995 | Ward | 134/38 |
| 5,431,766 | 7/1995 | Propst et al. | 156/345 |
| 5,461,003 | 10/1995 | Havemann et al. | 437/187 |
| 5,468,342 | 11/1995 | Nulty et al. | 156/643.1 |
| 5,475,267 | 12/1995 | Ishii et al. | 257/752 |
| 5,533,635 | 7/1996 | Man | 216/67 |
| 5,544,776 | 8/1996 | Okuda et al. | 216/83 |
| 5,556,482 | 9/1996 | Ward et al. | 134/38 |
| 5,571,447 | 11/1996 | Ward et al. | 510/206 |
| 5,591,299 | 1/1997 | Seaton et al. | 156/626.1 |
| 5,650,041 | 7/1997 | Gotoh et al. | 156/643.1 |
| 5,676,760 | 10/1997 | Aoki et al. | 134/1.3 |
| 5,698,503 | 12/1997 | Ward et al. | 510/176 |
| 5,709,756 | 1/1998 | Ward et al. | 134/1.3 |
| 5,756,402 | 5/1998 | Jimbo et al. | 438/724 |
| 5,780,363 | 7/1998 | Delehanty et al. | 438/748 |
| 5,824,601 | 10/1998 | Dao et al. | 438/713 |

FOREIGN PATENT DOCUMENTS

| | | |
|---|---|---|
| 238622 | 8/1986 | Germany . |
| 56-161677 | 12/1981 | Japan . |
| 58-110078 | 6/1983 | Japan . |
| 58-143532 | 8/1983 | Japan . |
| 58-204450 A2 | 11/1983 | Japan . |
| WO 97/02958 | 1/1997 | WIPO . |

OTHER PUBLICATIONS

El–Kareh, B., *Fundamentals of Semiconductor Processing Technologies*, Kluwer Academic Publishers, Norwell, MA, 1995: 565–571.

Anon, Flush Fluids for Ink Jet Ink Devices, *Research Disclosure*, Jan. 1991, No. 321.

"Etching $SiO_2$ Films in Aqueous 0.49% HF", Somashekhar et al. *J. Electrochem. Soc.*, vol. 143, No. 9, pp. 2885–2891, Sep. 1996.

*Primary Examiner*—Benjamin L. Utech
*Assistant Examiner*—Matthew Anderson
*Attorney, Agent, or Firm*—Pollock, Vande Sande & Amernick; Steven Capella

[57] ABSTRACT

Silicon oxide is removed from an article employing a liquid composition containing a fluoride-containing compound, organic solvent, and water. The methods of the invention are especially useful for removal of silicon oxide formed by thermal oxidation of a silicon substrate.

17 Claims, No Drawings

REMOVAL OF SILICON OXIDE

TECHNICAL FIELD

The present invention is concerned with removing silicon oxide from a substrate and particularly removing thermal silicon oxide without attacking underlying substrate also exposed to the composition used for removing the silicon oxide, the underlying substrate typically being a semiconductor substrate and more particularly a silicon substrate.

BACKGROUND

In the fabrication of microelectronic components, a number of the steps involved, for instance, in preparing integrated circuit chips and the packaging for the chips (articles to which the chips are attached for electrical interfacing and/or protection), are cleaning and etching processes. Accordingly, over the years, a number of vastly different types of etching processes to remove material, sometimes in selective areas, have been developed and are utilized to varying degrees. Moreover, the steps of etching different layers which constitute, for instance, the finished integrated circuit chip are among the most critical and crucial steps.

For example, producing an oxide-free silicon surface for rendering it ready for subsequent processing is often essential. In many processes, the silicon wafer, used in the production of integrated circuit chips, is processed to form wells along with desired isolation. Typically, an oxide layer may be thermally grown on the silicon substrate for protecting previously formed active silicon regions against adverse effects from subsequent processing steps, as well as for removing (by oxidation) the near or top surface silicon which may have been damaged or contaminated in the previous processing.

However, at some further point in the manufacturing process, this sacrificial silicon oxide layer typically must be removed to provide an oxide-free silicon surface (e.g. for construction of further features of the desired integrated circuit design). Where a gate is to be formed, this oxide removal step is commonly referred to as pre-gate cleaning. This cleaning is performed in an aqueous medium followed by a deionized water rinse or as a vapor-phase process using HF vapor. One of the problems related to aqueous processing is the appearance of water stains after the drying (water drying marks). These stains are becoming more and more of an issue in device manufacture as device dimensions are shrinking.

The mechanism behind the water stain formation is that water itself is a very aggressive chemical towards the bare silicon surface (more aggressive than HF for instance) and is a very good solvent for silica (silicon dioxide). During the rinsing process, silicon and silica dissolve in very small quantities in the deionized water forming mono-molecular soluble or colloidally-dispersed silicic acid (non-ionic because of the neutral pH of deionized water). Due to its has an extremely low solubility, its non-ionic nature and its non-volatility, the silicic acid deposits on the silicon wafer surface when the deionized water evaporates in the dryer. Other drying residues can originate from any intrinsic contaminants the still present in the already highly purified deionized water.

In addition to staining problems, the processes of the prior art often result in undesired roughening of the silicon surface.

It would therefore be desirable to provide a procedure capable of removing silicon oxide layers to render a surface oxide-free while avoiding or minimizing the problems associated with conventional deionized water-based processes.

SUMMARY OF INVENTION

The present invention is concerned with a method for selectively removing silicon oxide from a substrate. The process of the present invention comprises contacting an article having exposed silicon oxide with a liquid composition that contains about 0.05 to about 3 molar of a fluoride-containing compound, an organic solvent, and about 0.05 to about 3.5 molar of water to thereby remove at least a portion (more preferably all) of the exposed silicon oxide. The present invention makes possible the removal of silicon oxide to render the surface free of silicon oxide while minimizing or eliminating the occurrence of stains commonly associated with deionized water-based processes.

The organic solvents employed in the present invention typically have relatively high flash point and provide low viscosity compositions. Preferred solvents are propylene carbonate, N-methylpyrrolidone and gamma butyrolactone, ethylene glycol and propylene glycol with propylene carbonate being the most preferred. HF is a preferred fluoride-containing compound.

The processes of the invention are especially useful for the removal of oxide layers from silicon substrates where the oxide was formed by thermal oxidation.

Other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The present invention is concerned with removing silicon oxide, especially silicon oxide formed by thermal oxidation of underlying silicon substrate. The present invention enables the removal the silicon oxide without the creation of significant residual stains on the substrate. The processes of the invention are preferably used to remove high density silicon oxide, such as silicon dioxide formed by heating a silicon substrate typically at temperatures of about 800 to about 1100° C. in the presence of dry or wet $O_2$. The processes of the invention are not limited to the removal of any particular oxide thickness, however, the processes of the invention are especially useful for treating articles containing a layer of about 30 to 200 Å thick of silicon oxide (especially thermal oxide layer) on a silicon substrate. Such oxide layers are often used as sacrificial oxide layers in semiconductor processing.

The liquid compositions employed pursuant to the present invention contain a fluoride-containing compound, an organic solvent and water. The amount of the fluoride-containing compound in the composition is preferably about 0.05 to about 3 molar, more preferably about 0.2 to about 2.5 molar, most preferably about 0.25 to about 1.5 molar. The amount of water in the composition is preferably about 0.05 to about 3.5 molar, more preferably about 0.2 to about 2.9 molar, most preferably about 0.25 to about 1.7 molar. The molarities indicated above are based on the total volume of the liquid composition.

The fluoride-containing compound may be any compound capable of providing fluorine ion activity for removal of the oxide. Preferably, the fluoride-containing compound is chosen to avoid adverse effects with the underlying substrate and the other components of the liquid composition. Examples of suitable fluoride-containing compounds for use according to the present invention are hydrofluoric acid, ammonium fluoride, fluoroborates, fluoroboric acid, tin bifluoride, antimony fluoride, tetrabutylammonium tetrafluoroborate, and aluminum hexafluoride. Also, fluoride salts of an aliphatic primary, secondary or tertiary alkyl amines can be used (the alkyl groups preferably being $C_1$–$C_{12}$ alkyl groups). The preferred fluoride-containing compounds are hydrogen fluoride and ammonium fluoride, with hydrogen fluoride being most preferred. If a fluoride-containing compound other than HF is used, the molarity of that compound is preferably adjusted to provide an fluorine ion activity (F concentration) in the liquid composition equivalent to that provided by an amount of HF in the above molarity ranges.

Controlling the amount of water in the liquid compositions used in the processes of the invention is important in the prevention of the problems associated with conventional aqueous processing. Where the fluoride-containing compound source of choice contains a significant amount of water (e.g., a typical commercial 49 weight percent aqueous HF solution), the overall water content of the liquid composition may be controlled by addition of a dehydrating agent, by evaporation of the excess water or by other suitable water removal technique. The selection of a specific water removal technique may depend on the nature of the components making up the liquid composition. For example, use of a specific dehydrating agent may not be desirable if the agent would be have an adverse interaction with the fluoride component or the use of evaporation may not be efficient where a desired component already present in the liquid composition has a high volatility. Such techniques may be generally employed to reduce the water content of the liquid composition.

Examples of suitable dehydrating agents useful in the invention are alkyl anhydrides and aryl anhydrides. The alkyl group preferably contains 1–8 carbon atoms and the aryl group preferably contains 6–10 carbon atoms in the ring. The aryl groups can be substituted on the ring with an alkyl group containing 1–8 carbon atoms. Acetic anhydride and benzoic anhydride are generally preferred. As noted above, the selected dehydrating agent preferably does not adversely affect to an undesirable extent the performance characteristics of the composition. Other suitable dehydrating agents include triethylorthoformate and 2,2' dimethoxypropane. The amount of the anhydride is preferably less than one anhydride group (O=COC=O) per $H_2O$ molecule, so that the composition retains the desired amount of water.

In the alternative, the cleaning composition can be produced by adding the fluoride-containing compound as a non-aqueous component such as by bubbling anhydrous HF gas into the organic solvent or by adding an organic fluoride.

Examples of suitable organic solvent compounds for use in the invention include oxolanes, sulfolanes, esters, ketones, aldehydes, lactones, halogenated hydrocarbons, amines, imides and alcohols (including mono- and polyhydric alcohols). Examples of suitable esters are esters of carbonic acids, benzoic acid, phthalic acid, isophthalic acid and terephthalic acid, and especially the $C_1$–$C_6$ alkyl esters. Preferred organic solvents are propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, and methyl and ethyl esters of phthalic, isophthalic or terephthalic acids.

The more preferred solvents employed pursuant to the present invention are propylene carbonate, N-methylpyrrolidone and gamma butyrolactone, ethylene glycol and propylene glycol with propylene carbonate being the most preferred.

Organic solvents employed in the present invention preferably enable the overall liquid composition to have a low viscosity. Low viscosity is desirable for improving overall workability of the composition as used in the processes of the invention and for providing better oxide removal uniformity. The organic solvent used in the compositions of the invention preferably have an absolute viscosity less than that of glycerol at 20° C. Thus, while glycerol can be used as the organic solvent in embodiments of the invention, it is generally not preferred.

The oxide removal processes of the present invention are preferably carried out at temperatures of about 20° C. to about 90° C., more preferably about 30° C. to about 70° C. Employing increased temperature generally results in increasing the removal rates of the silicon oxide. For example, a solution providing a thermal oxide etch rate of about 20 Å/min. at room temperature may provide an etch rate to about 60 Å/min. at about 70° C. The oxide removal processes of the invention generally avoid removal of any measurable amount of silicon or other material making up the underlying substrate.

If desired, the oxide removal step of the present invention can be followed by non-aqueous rinsing step (e.g. isopropyl alcohol or other low viscosity, low boiling point solvent) and a drying step (such as isopropyl alcohol vapor drying).

The following non-limiting examples are presented to further illustrate the present invention.

EXAMPLE 1

A cleaning composition is prepared by admixing one part by volume of a 49 percent by weight aqueous solution of HF with about 14 parts by volume of propylene carbonate to provide a 2 molar HF solution in propylene carbonate. Acetic anhydride is added to the solution in an amount to provide about 2.5 molar (prior to reaction with the water from the initial HF solution) concentration of the acetic anhydride. A silicon wafer containing a layer of about 30–60 Å of thermally grown silicon oxide thereon is immersed in the liquid cleaning composition. The cleaning (oxide removal step) is carried out at temperature of about 35° C. for about 45 seconds. The cleaning solution removes the silicon oxide without removing any measurable amount of the underlying silicon wafer.

In this disclosure, there are shown and described only the preferred embodiments of the invention, but as aforementioned, it is to be understood that the invention is capable of use in various other combinations and environments and is capable of changes or modifications within the scope of the inventive concept as expressed herein.

What is claimed is:

1. A method for removing silicon oxide which comprises contacting an article containing said silicon oxide with a substantially non-aqueous cleaning composition containing about 0.05 to about 3 molar of a fluoride containing compound, an organic solvent selected from the group consisting of propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, methyl and ethyl esters of acid selected from the group consisting of phthalic acid, isophthilic acid and terephthalic acid, and about 0.05 to about 3.5 molar of water, to thereby remove said silicon oxide.

2. The method of claim 1 wherein said article comprises a silicon substrate and said silicon oxide is produced by thermal oxidation of said silicon substrate.

3. The method of claim 1 wherein said organic solvent is selected from the group consisting of propylene carbonate, N-methyl pyrrolidone and gamma butyrolactone.

4. The method of claim 1 wherein said solvent is propylene carbonate.

5. The method of claim 1 wherein said fluoride-containing compound is selected from the group consisting of hydrofluoric acid, ammonium fluoride, fluoroborates, tetrabutylammonium tetrafluoroborate, fluoroboric acid, aluminum hexafluoride, tin bifluoride, antimony fluoride and fluoride salt of an aliphatic primary, secondary or tertiary amine.

6. The method of claim 1 wherein said fluoride-containing compound is hydrofluoric acid or ammonium fluoride.

7. The method of claim 1 wherein said fluoride-containing compound is hydrofluoric acid.

8. The method of claim 1 wherein an anhydride is added to said liquid composition before said contacting step.

9. The method of claim 8 wherein said anhydride is an alkyl anhydride or aryl anhydride.

10. The method of claim 8 wherein said anhydride is acetic anhydride.

11. The method of claim 1 wherein the amount of said fluoride-containing compound is about 0.2 to about 2.5 molar.

12. The method of claim 1 wherein the amount of said fluoride-containing compound is about 0.25 to about 1.5 molar.

13. The method of claim 1 wherein the contacting with said composition is carried out at a temperature of about 20° C. to about 90° C.

14. The method of claim 1 wherein the contacting with said composition is carried out at a temperature of about 30° C. to about 70° C.

15. The method of claim 1 wherein said silicon oxide is a layer of silicon oxide of about 30 to about 200 Å located on an underlying silicon substrate.

16. The method of claim 1 wherein said contacting is conducted until said exposed oxide is completely removed.

17. The method of claim 1 further comprising, after said contacting, rinsing said article in a non-aqueous solvent and drying said article.

* * * * *